United States Patent
Boser et al.

(10) Patent No.: US 10,284,208 B2
(45) Date of Patent: May 7, 2019

(54) FREQUENCY TUNING AND/OR FREQUENCY TRACKING OF A MECHANICAL SYSTEM WITH LOW SENSITIVITY TO ELECTRICAL FEEDTHROUGH

(71) Applicant: THE REGENTS OF THE UNIVERSITY OF CALIFORNIA, Oakland, CA (US)

(72) Inventors: Bernhard Boser, Berkeley, CA (US);
Richard Przybyla, Berkeley, CA (US);
Hao-Yen Tang, Berkeley, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 300 days.

(21) Appl. No.: 15/226,470

(22) Filed: Aug. 2, 2016

(65) Prior Publication Data
US 2016/0380640 A1    Dec. 29, 2016

Related U.S. Application Data

(63) Continuation of application No. PCT/US2015/014588, filed on Feb. 5, 2015.
(Continued)

(51) Int. Cl.
*H03L 7/093* (2006.01)
*G01S 7/52* (2006.01)
(Continued)

(52) U.S. Cl.
CPC .......... *H03L 7/093* (2013.01); *G01S 7/52004* (2013.01); *H03H 11/30* (2013.01);
(Continued)

(58) Field of Classification Search
CPC .......... H03L 7/093; H03L 7/00; H03H 11/30; G01S 7/52004; H03K 5/2481; H03K 3/0231
See application file for complete search history.

(56) References Cited

U.S. PATENT DOCUMENTS 5,079,751 A    1/1992 Woodward
5,157,639 A * 10/1992 Leszczynski .......... G01S 7/539
                                              367/908

(Continued)

FOREIGN PATENT DOCUMENTS

EP        1293802 B1      3/2003
EP        3103191 A4 *   10/2017
WO    WO-2015120132 A1 *  8/2015 .......... H03K 3/0231

OTHER PUBLICATIONS

European Patent Office (EPO), Communication pursuant to Article 94(3) EPC dated Sep. 25, 2017, related EPO application No. 15 746 509.7, pp. 1-5, with claims examined, pp. 6-9.

(Continued)

*Primary Examiner* — Daniel Pihulic
(74) *Attorney, Agent, or Firm* — O'Banion & Ritchey LLP; John P. O'Banion (57) ABSTRACT

An apparatus and method for frequency tuning/tracking between an electrical subsystem and a mechanical transducer subsystem is presented. An electromechanical transducer generates acoustic pulses as it is driven by a transmit signal from an electrical subsystem. As the transmit signal goes inactive, the settling behavior of the transducer is registered from which the difference in frequency between the resonance of the electromechanical transducer and the transmit signal frequency is determined and utilized for locking the electrical subsystem to the mechanical transducer subsystem by either tuning operating frequency of the electrical subsystem, or the mechanical transducer, to keep them matched (locked).

37 Claims, 6 Drawing Sheets

Related U.S. Application Data (60) Provisional application No. 61/937,430, filed on Feb. 7, 2014.

(51) Int. Cl.
*H03H 11/30* (2006.01)
*H03K 3/0231* (2006.01)
*H03K 5/24* (2006.01)
*H03L 7/00* (2006.01)

(52) U.S. Cl.
CPC ......... *H03K 3/0231* (2013.01); *H03K 5/2481* (2013.01); *H03L 7/00* (2013.01)

(56) References Cited

U.S. PATENT DOCUMENTS

| | | | |
|---|---|---|---|
| 5,277,065 A * | 1/1994 | Leszczynski | G01F 23/2962 367/903 |
| 5,335,545 A * | 8/1994 | Leszczynski | G01F 23/2962 367/903 |
| 5,511,041 A | 4/1996 | Michalski | |
| 5,991,234 A * | 11/1999 | Sejalon | B06B 1/0246 367/13 |
| 8,427,249 B1 | 4/2013 | Swanson et al. | |
| 2004/0004905 A1 | 1/2004 | Lyon et al. | |
| 2006/0154615 A1 | 7/2006 | Palermo et al. | |
| 2010/0155883 A1 | 6/2010 | Wenzler et al. | |
| 2015/0162851 A1* | 6/2015 | Klootwijk | B06B 1/0292 310/300 |
| 2016/0380640 A1* | 12/2016 | Boser | H03K 3/0231 367/13 |

OTHER PUBLICATIONS

Korean Intellectual Property Office (KIPO), International Search Report and Written Opinion, PCT International Application No. PCT/US2015/014588, dated May 15, 2015, pp. 1-10, with claims searched, pp. 11-17.

\* cited by examiner

FREQUENCY TUNING AND/OR FREQUENCY TRACKING OF A MECHANICAL SYSTEM WITH LOW SENSITIVITY TO ELECTRICAL FEEDTHROUGH

CROSS-REFERENCE TO RELATED APPLICATIONS

This application is a 35 U.S.C. § 111(a) continuation of PCT international application number PCT/US2015/014588 filed on Feb. 5, 2015, incorporated herein by reference in its entirety, which claims priority to, and the benefit of, U.S. provisional patent application Ser. No. 61/937,430 filed on Feb. 7, 2014, incorporated herein by reference in its entirety. Priority is claimed to each of the foregoing applications.

The above-referenced PCT international application was published as PCT International Publication No. WO 2015/120132 on Aug. 13, 2015, which publication is incorporated herein by reference in its entirety.

STATEMENT REGARDING FEDERALLY SPONSORED RESEARCH OR DEVELOPMENT

Not Applicable

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technological Field

This technical disclosure pertains generally to electromechanical transducers and sensors, and more particularly to electromechanical transducers and sensors with enhanced frequency stability and tracking.

2. Background Discussion

Mechanical systems (and subsystems) typically have one or more resonant frequencies arising from various vibrational modes of the system. One important category of these mechanical systems are electromechanical transducers which convert mechanical motion into electrical signals in a sensing operation, and/or convert electrical signals into mechanical motion in an actuation operation. A transducer can therefore be used to sense the motion of a mechanical structure during actuation. It is often desirable to use the same transducer to actuate and sense the motion of the mechanical structure. However, there is often electrical feedthrough from the actuation signal to the sensor signal, which corrupts the sensor signal.

Electromechanical actuators may be configured to operate at or near resonance in order to increase the motion of the device, and mechanical sensors may also be operated at resonance to increase the sensitivity of the device. However, these electromechanical actuators and sensors suffer from variation in mechanical resonance that can arise due to fabrication tolerances and frequency drifting in response to changes in temperature, stress, humidity, or other ambient conditions.

In practice, electrical systems (and subsystems) are generally coupled to an electromechanical or electrical oscillator, and themselves may also vary in frequency due to fabrication tolerances, and be subject to frequency drift in response to changes in temperature, stress, humidity, or other ambient conditions. Therefore, in a system having an electrical subsystem and a mechanical subsystem, the resonance of the mechanical subsystem may drift independently of the operational frequency of the electrical subsystem.

Accordingly, a need exists for apparatus and methods which enables the resonance in an electromechanical system to be tracked by an electrical subsystem. The disclosure presented fulfills that need and provides additional benefits for resonant electromechanical systems.

BRIEF SUMMARY

An apparatus and method are presented for stabilizing the resonant frequency of an electromechanical subsystem as controlled by an electrical subsystem. The electromechanical subsystem is locked in frequency to the electrical subsystem by either: (a) tuning the operating frequency of the electrical system to match that of the mechanical system, or (b) tuning the operating frequency of the mechanical system to match that of the electrical system. Resonance frequency for the electromechanical subsystem is determined from its settling response after cessation of transmission during a ring down period. During the ring down period, a ring down circuit is activated which attenuates resonance of the electromechanical subsystem in a controlled manner allowing settling response to be readily determined.

By way of example and not limitation, the system is described utilized with an array of electromechanical transducers/sensors (e.g., ultrasonic transducers/sensors) configured for using pulse-echo time-of-flight ranging for discerning objects, and object motion. Although objects can be detected in a number of applications, the example presented is for using these techniques in a gesture recognition process. This pulse-echo time-of-flight utilizing MEMS ultrasonic rangers can operate over distances of up to approximately one meter and achieve sub-mm ranging accuracy. It will be noted, however, that the frequency tuning process of the present disclosure can apply to a wide variety of mechanical-coupled electromechanical systems, without limitation as to range. Using a one-dimensional transducer array, objects can be localized in two dimensions, while utilizing a two-dimensional transducer array allows localizing objects in three dimensions. The present disclosure may be utilized in an application of ultrasonic 3D gesture recognition, such as those based on a custom transducer chip and an ASIC to sense the location of targets such as hands, or in other applications benefiting from frequency tuning/tracking between a resonant mechanical system and an electrical system.

In systems, such as those described above, in which an electrical subsystem excites the resonance of the mechanical subsystem with a narrowband signal, or the electrical subsystem monitors the output of the mechanical subsystem in a narrow band of frequencies, there is a need to lock the operational frequency of the electrical subsystem to the desired resonant mode of the mechanical subsystem.

In order to measure the resonant frequency of a mechanical mode with high quality factor, it is desirable to excite the transducer with a harmonic signal near the resonant frequency, in order to elicit a large response, and to monitor this response to determine the resonant frequency. In order to avoid corrupting the response signal with the excitation signal, the excitation signal is halted after sufficient time to excite the resonance.

Further aspects of the presented technology will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The disclosed technology will be more fully understood by reference to the following drawings which are for illustrative purposes only.

DETAILED DESCRIPTION

A method and apparatus for locking an electrical system to a resonant electromechanical system is disclosed. In at least one embodiment, one or more ultrasonic (ultrasound) transducers, each having a narrowband resonance, are used to transmit and receive acoustic pulses. The transducer has maximum transmit and receive sensitivity at the resonant frequency of the transducer. However, the center frequency of transducer resonance can vary due to fabrication tolerances, mechanical stress, change in atmospheric pressure, or change in temperature. Atmospheric contaminants, such as dust or humidity, can also affect the resonance of the transducer.

An electrical subsystem actuates each transducer to launch acoustic waves, and then switches to receive mode and listens for acoustic echoes that return to the transducers.

It will be appreciated that a plurality of these transducers may be utilized, such as configured into one dimensional arrays or multi-dimensional arrays. The primary goal of the system is to transmit an acoustic pulse at the proper resonant frequency of the mechanical subsystem. Optionally, information about the returning echoes is measured according to at least one embodiment, such as measuring the time-of-flight. The electrical subsystem has an independent timing reference, hereafter referred to as a clock, that may be generated electrically or using an additional mechanical resonator. The transmitted signal is preferentially a harmonic signal with a center frequency equal to that of the transducer resonant frequency. In at least one embodiment, the transmitted signal is configured for containing a form of amplitude or phase modulation, or a combination thereof. The received signal is preferentially filtered with an electrical filter that has a center frequency equal to that of the transducer.

Figure 1A:
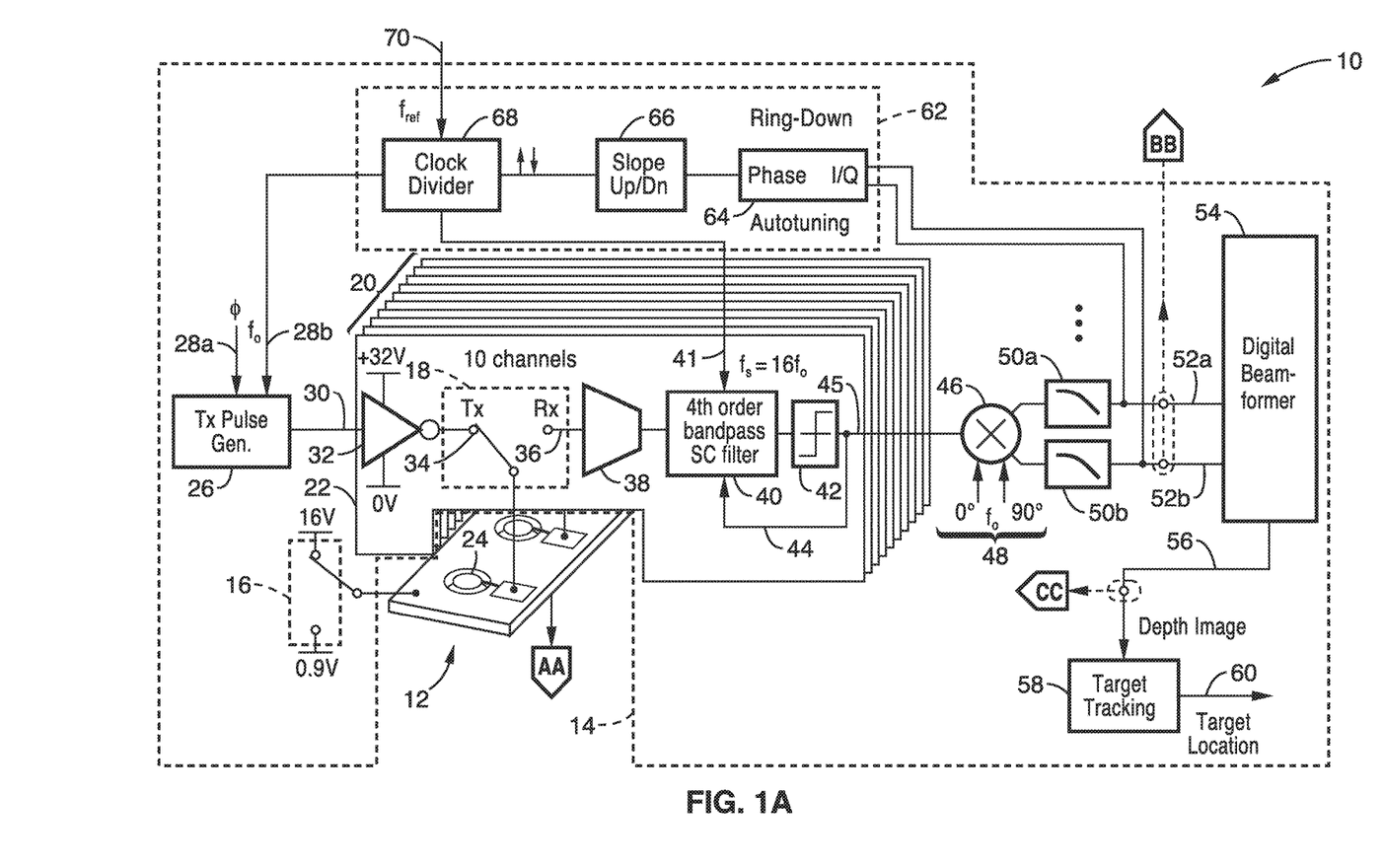
FIG. 1A is a block diagram for frequency tuning and/or tracking of a mechanical system with low sensitivity to electrical feedthrough according to an embodiment of the present disclosure.

FIG. 1A illustrates an example of a resonant frequency tuning and/or tracking embodiment 10, shown for using pulse-echo time-of-flight methods. An electromechanical subsystem 12 is shown coupled to an electrical subsystem 14 having multiple transceiver channels that interface with a micro-electromechanical system (MEMS) transducer, each including a transmitter and a readout circuit. By way of example the embodiment shown utilizes ten transceiver channels 20. Echoes from off-axis targets arrive with different phase shifts for each element in the array. The off-chip digital beam former realigns the signal phase to maximize the SNR and determine target location.

Electromechanical subsystem 12 is shown coupled to electrical subsystem 14 through a series of switches 16, 18. Multiple channel circuits 20 are shown with channel circuit 22 visible in the figure. The switches are configured to connect each of the multiple electromechanical actuators (transducers) 24 in the electromechanical subsystem to a transmitter circuit 32 or to a receiver circuit 38 within each of the multiple channel circuits 20, such as channel circuit 22.

During a measurement, switch 18 is initially in transmit (Tx) position 34, allowing the electrical subsystem to actuate one or more transducers 24 to transmit an acoustic pulse, after which switch 18 is switched to receive (Rx) position 36 to then monitor the response of transducer 24 via receive amplifier 38. Optionally, it can receive any echoes that return, and calculate the time-of-flight of those echoes.

On the transmit side is shown a transmit pulse generator 26 coupled to each channel 22 of multiple channels 20. A phase input 28a and a frequency input 28b are used to configure the frequency and phase of pulse generator 26, which outputs transmit pulses 30 to a driver 32 to a transmit connection of switch 34 coupled to transducer 24. It should be appreciated that in at least one embodiment, pulse generator 26 or clock circuitry 62, is configured to include a modulator which receives at least one signal that is encoded into the transmission using a form of amplitude modulation, or phase modulation, or a combination of amplitude and phase modulation.

Switch 16 controls a direct current (DC) voltage source connection to electromechanical transducers 24, seen in this example for selecting between 16 volts during the transmit period and 0.9 volts during the receive period. In this example, the transmitter driver 32 operates at 32V P-P centered on the 16V supply (bias) voltage. In receiving mode, however, signal amplitudes are significantly lower, and switch 16 sets the DC voltage on transducers 24 to half the supply voltage of receive amplifier 38 (e.g., 0.9V).

On the receive side, when switch 18 is in the receive position 36, then signals from sensor 24 (transducer 24 operated in its sensor mode) are coupled to an analog interface circuit 38, such as comprising an analog amplifier (e.g., a transconductance amplifier). After amplifying the analog signal from the sensor, it is preferably filtered 40, using, for example, a fourth order bandpass switched-capacitor filter, shown receiving a switching clock $f_s$ 41, for example where $f_s=16\ f_0$, and where $f_0$ is the resonant frequency of the transducer. After filtering the analog signal it is converted, for instance, by a comparator 42, to digital signal 45. It will be noted that this digital signal is fed back 44 (in a feedback arrangement) to filter 40. A complex demodulator 46 receives digital signal 45, along with clock signals 48 at $f_0$ (phase-shifted by 0° and 90°), and outputs separate digital signals 52a, 52b, for in-phase (I) and quadrature (Q), that are preferably filtered 50a, 50b, utilizing known digital filtering techniques, and output to a digital beam-former 54. Output 56 from the digital beam-former 54 provides depth image from which target tracking 58 is performed to output a target location 60.

A frequency adjustment circuit 62 is shown for performing frequency tuning to maintain a frequency match between the electromechanical and electrical subsystems. In the example shown, the matching is arrived at by altering the transmitter pulse generation frequency to match that of the resonant mechanical subsystem. Digital I and Q outputs 52a, 52b, are received by a ring down auto tuning circuit 64, whose output is subject to slope detection (up/down) 66, which controls a clock divider 68, which receives a reference clock 70 $f_{ref}$, and outputs clock rate $f_0$. It should be appreciated, however, that frequency generation according to the present disclosure is not limited to utilizing a clock-divider configuration, as it will be recognized that other methods can be similarly utilized (e.g., phase-locked loop), which are controllable in response to receiving auto tuning signals described herein. Additional details about the functioning of these elements is described through the following sections.

Settling behavior during ring down was utilized for determining the extent of frequency mismatch between the electrical and mechanical systems. In the above example, this mismatch was corrected by adjusting the clock frequency utilized in transmitter pulse generation. It should also be appreciated that this mismatch can be corrected via adjustments to the mechanical subsystem. In this embodiment, the resonant frequency of the electromechanical transducer is thus changed in response to receipt of a control signal (e.g., voltage). First, it will be recognized that different bias voltages applied across a piezoelectric material result in changing the stress across the material and thus its resonant frequency (by some small amount). In another embodiment, a resistive heating element on the electromechanical transducer would allow the temperature of the transducer to be varied, thereby varying the frequency of the transducer. In addition, it will be recognized that so called "smart materials" may be utilized in the transducer (making the transducer of smart material, or mechanically coupling a smart material to the transducer) to allow making slight adjustments to resonant frequency. Smart materials are designed materials that have one or more properties, stiffness being one of these properties, that can be changed in a controlled manner by an external stimulus, such as stress, temperature, moisture, pH, electrical voltage, electrical current or magnetic fields. One of ordinary skill in the art will also appreciate that many different forms of MEMS actuators (e.g., comb-drives, parallel plate capacitive drives) can be coupled to the transducer for changing the mechanical stiffness and therefore resonance frequency of the electromechanical resonator. For example using a voltage to pull in a stiffening arm (or layer) against the transducer, or changing the extent to which interlocked comb fingers extend across a surface of the transducer. Thus, it will be seen that there are two mechanisms for achieving this locking between the frequencies of the mechanical and electrical subsystems.

Figure 1B:
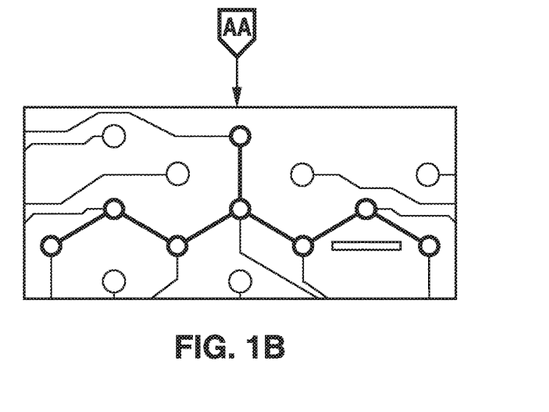
FIG. 1B is a rendition of a portion of a MEMS ultrasound chip utilized according to an embodiment of the present disclosure.

FIG. 1B illustrates a portion of an ultrasonic chip according to the presented disclosure. A readout integrated circuit (IC) was fabricated in a 0.18 μm CMOS process with 32V transistors. To provide a 1 m maximum range, the system embodiment presented herein required 13.6 μJ per measurement. At 30 fps, the receive power consumption was 335 μW and the transmit power consumption at 66 μW. The amount of energy consumption scaled roughly linearly with maximum range. For a maximum range of 0.3 m, the energy per frame was reduced to less than 0.5 μJ per channel per frame. Single-element range measurements could be performed with the apparatus at 10 fps using only 5 μW.

Figure 1C:
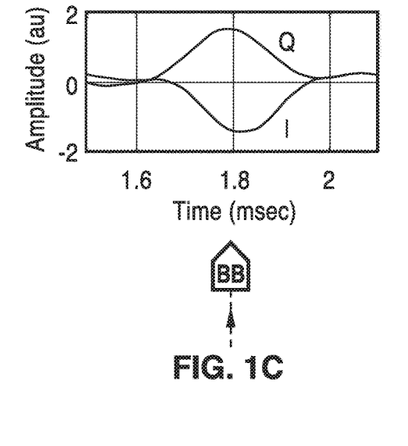
FIG. 1C is a plot of measured amplitude values of I and Q according to an embodiment of the present disclosure.

FIG. 1C depicts measured amplitude values for in-phase (I) and quadrature (Q) signals with respect to time as output by the digital beam former.

Figure 1D:
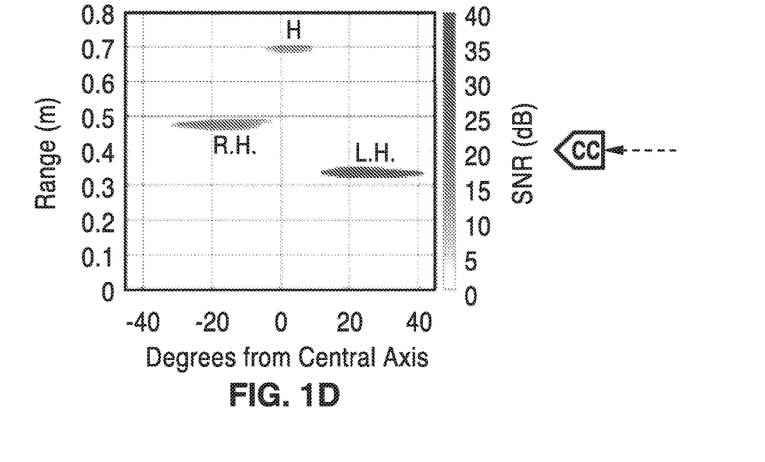
FIG. 1D is a plot of position and depth of nearby objects using a electromechanical transducer system according to an embodiment of the present disclosure.

FIG. 1D illustrates a single pulse measurement using a 2D electromechanical transducer array according to at least one embodiment of the apparatus. In this test, a target individual held up their hands below head height at different positions and depths. The graph shows how these were discerned as to position and depth for head (H), right hand (R.H.) and left hand (L.H.).

Figure 2:
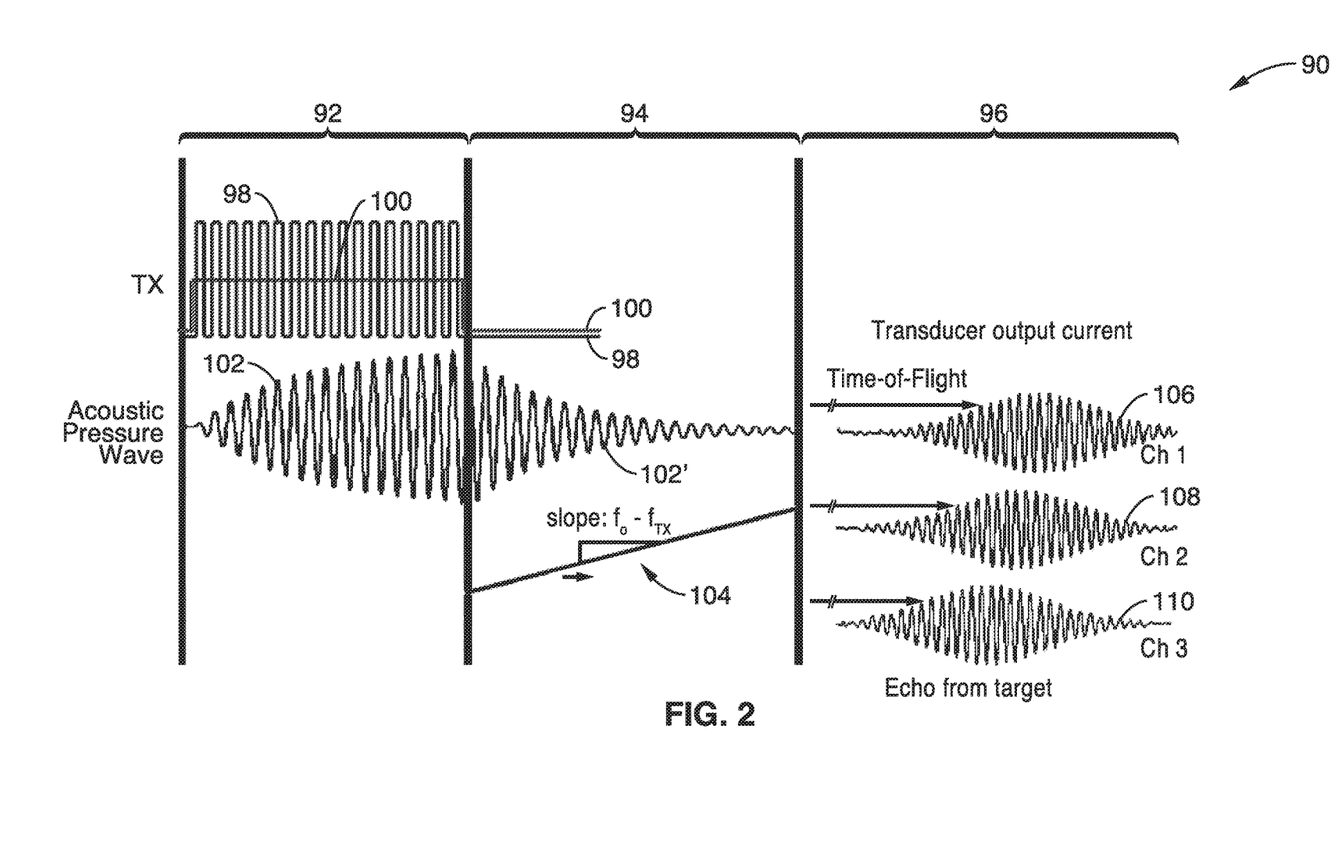
FIG. 2 is a plot of operating phases showing transmission, ring down, and measurement of returned echoes according to an embodiment of the present disclosure.

FIG. 2 illustrates example waveforms 90 generally depicting three phases of the described apparatus showing a transmit cycle 92, auto-tuning cycle 94, and receive cycle 96. During a first phase 92, a transmitter signal 98 shown with bottom electrode voltage 100, drives a transducer with a harmonic signal having a frequency of $f_{TX}$. It will be appreciated that by way of example and not limitation, the time durations of these cycles were set for 140, 140, and 5.5 μs. During the transmit phase, the velocity in the transducer builds up 102 and an acoustic pulse is emitted. At the end of transmit phase 92 energy remains stored in the transducer as it resonates. This energy rings down, seen as ring down signal 102', at the natural frequency of the transducer $f_0$. This ring down arises in a phase utilized for performing an auto-tuning cycle 94, the transmit switch is opened and the receive switch is closed, and the receive electronics are enabled and used to convert the transducer ring down signal to a digital representation, utilized for adjusting transmit frequency. The receive electronics may contain a narrowband analog filter which is tunable, and which is tuned to $f_{TX}$ prior to the start of a measurement cycle. This narrowband filter could be constructed using switched capacitor (SC) or continuous time (CT) techniques. The analog filter may have a tunable bandwidth.

Following the analog-to-digital conversion, the digital signal is complex demodulated in a phase sensitive fashion, and the in-phase (I) and quadrature (Q) signals are digitally filtered separately. The digital filters may have tunable bandwidths. The I and Q signals are converted into magnitude and phase signals. A non-zero slope ($f_0-f_{TX}$) 104 of the phase signal indicates a frequency mismatch between $f_{TX}$ and $f_0$. The slope of the line can be measured by averaging the difference of the phase signal between several samples. The resulting phase slope is the frequency offset between the transmit frequency $f_{TX}$ and the resonant frequency $f_0$. It is used to update $f_{TX}$ prior to the next measurement cycle.

In at least one embodiment, a deadband controller is utilized for this updating. In the deadband controller the sign of the frequency error is measured, and the frequency is updated by a fixed step Δf in the direction that minimizes the error, unless the frequency error is less than a certain tolerance, in which case $f_{TX}$ is not updated.

Additionally, the magnitude signal may be used to estimate the time constant and therefore the bandwidth of the transducer. The exponential decay of the magnitude of the ring down response has a characteristic time constant τ, and the response is given by:

$$s(t) = s_i e^{-t/\tau},$$

where s(t) is the magnitude signal with respect to time, $s_i$ is the initial magnitude of the ring down response, and where the harmonic response due to mismatch between $f_{TX}$ and $f_0$ is neglected. The value τ can be measured by storing the magnitude s1 shortly after the auto-tuning cycle begins, and then measuring the time until the magnitude reaches a certain fraction of its initial value s2. The time constant is then given by $$\tau = t_{meas} \ln\left(\frac{s_1}{s_2}\right).$$

Alternatively, the magnitude signal may be measured after a fixed time delay, and the ratio of the second magnitude measurement to the first can be used to determine the time constant.

The measured time constant of the transducer can be used to adjust the bandwidth of the passband of the analog filter and/or the digital filter described herein.

Following the auto-tuning phase, the optional receive cycle 96 proceeds. During this cycle the receive electronics convert received echoes to digital signals. The figure shows different time of flight (TOF) values for channels 1-3, as waveforms 106, 108, 110. By way of example and not limitation, the same receive electronics utilized for processing the ring down signal can be utilized to process received echo signals.

In at least one embodiment, the receive electronics contain a narrowband tunable analog filter 40 (FIG. 1A), which is tuned to $f_{TX}$ prior to the start of a measurement cycle. By way of example, this narrowband filter can be implemented using switched-capacitor (SC) techniques or continuous-time (CT) techniques, as will be known to those of ordinary skill in the art. In at least one embodiment of the apparatus, the analog filter is configured with a tunable bandwidth.

Following the analog-to-digital conversion, the digital signal is complex demodulated 46 (FIG. 1) in a phase sensitive fashion, and the in-phase (I) and quadrature (Q) signals are digitally filtered 50*a*, 50*b*, separately. In at least one embodiment, the digital filters are configured with tunable bandwidths.

In at least one embodiment, the received echo signals are monitored for frequency shifts between the received signal frequency $f_{RX}$ and $f_{TX}$, manifested as non-zero slope of phase signals during a received echo, using the techniques described herein. In at least one embodiment, the frequency shift $f_{RX}-f_{TX}$ is utilized for determining the relative axial velocity between the transducers and the target position. This frequency shift arises from the Doppler effect.

It will be appreciated that there are three general modes of operation: transmit, auto-tuning (during ring down), and then receive. After transmitting a series of pulses from the transducer, the auto-tuning phase is entered. During auto-tuning, the receive switch is turned on, along with a ring down switch and the electrical system receives and processes the ring down signal. This ring down signal from the transducer arises from the fact that after transmitting, there is energy stored in the transducer, and that energy rings down at a frequency equal to $f_0$. After auto-tuning, the ring down switch is deactivated, thus decoupling the ring down circuit, and the system enters a measurement phase (optional), in which acoustic echoes are registered on the transducer (or transducers) and processed. It should be appreciated that these received pulses are ancillary to the auto-tuning operation, for in certain applications the auto-tuning of the present disclosure tunes the electronics to the transmitter even if the electrical subsystem does not receive acoustic echoes to be processed.

In the example embodiment described, the electromechanical transducers/sensors comprises an ultrasonic transducer/sensor, such as a piezoelectric micromachined ultrasound transducers (pMUTs) having a 450 μm diameter with 2.2 μm thick AlN/Mo/AlN/Al stack deposited on a Si wafer and released with a back-side through-wafer etch. The bottom electrode is continuous, while each pMUT has a top electrode lithographically defined to actuate the trampoline mode. Each pMUT can transmit and receive sound waves, and is operated at its resonance of 217 kHz±2 kHz with a bandwidth of 12 kHz. The impedance of the transducers is dominated by the 10 pF transducer capacitance, and the motional resistance at resonance is ~2.4 MΩ. The resonant frequencies of the pMUTs vary due to fabrication, temperature, and packaging stress, so online frequency tracking is used to maintain maximum SNR during operation.

In one configuration two pMUTs are utilized for transmission and seven pMUTs for reception. The receive array is 3.5 wavelengths wide in the x-angle axis, allowing targets separated by more than 15° to be distinguished. In the y-angle axis the array is only 0.16 wavelengths wide, sufficient to determine the y-angle to the target by measuring the average phase difference along the y axis of the array. The center element of the receive array and the element 900 μm above it are used to launch a 138 μsec≈24 mm long pulse of sound into the environment. The transmit configuration illuminates a wide field of view, permitting the capture of an entire scene in a single measurement. Applications requiring improved target resolution or increased maximum range can also use transmit beamforming at the expense of reduced measurement rate.

Figure 3A:
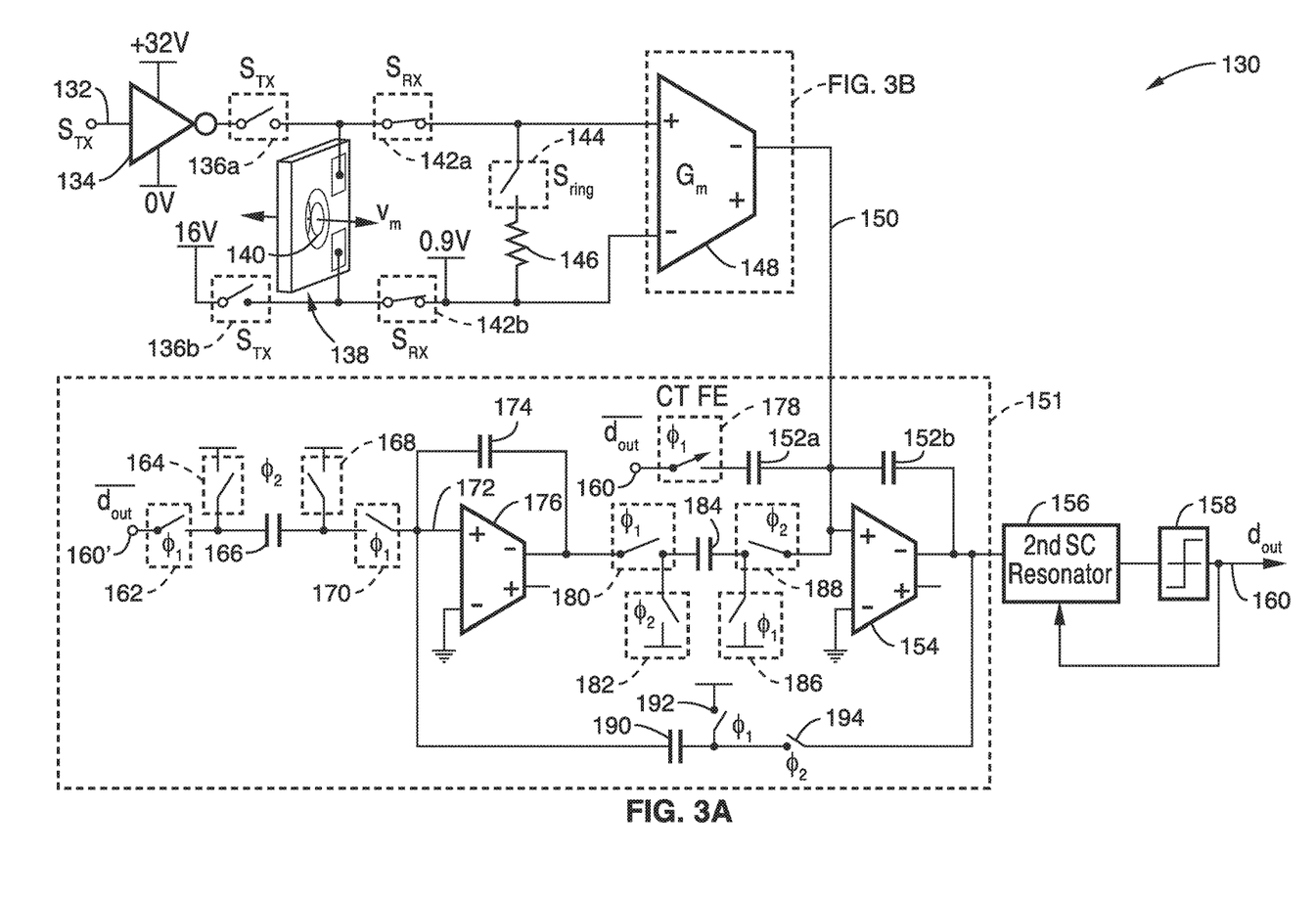
FIG. 3A is a block diagram of a switched-capacitor (SC) resonator and continuous-time (CT) anti-aliasing (AA) filter according to an embodiment of the present disclosure.

FIG. 3A illustrates an example embodiment 130 of a single channel of switched-capacitor (SC) resonator with a continuous-time (CT) anti-aliasing (AA) filter. An electromechanical subsystem 138 is shown with a transducer 140. A $S_{TX}$ signal 132 is voltage-shifted using high voltage level shifters 134 (e.g., 32V) through transmit switch 136*a*, in combination with a bias voltage (16V) through switch 136*b*, to drive transducer 140 in a transmit mode. It will be noted that setting the bottom electrode of the transducer to 16V permits bi-polar actuation of the transducer, when excited by a 32 $V_{pp}$ square wave. In the example, such as seen by waveform 98 in FIG. 2, transmission is performed for 30 cycles at the transmit frequency $f_{TX}$ which is locked to ¹⁄₁₆th of the sampling frequency $f_s$.

At the end of the transmit phase, the mechanical energy stored in the inertia of the pMUT dissipates through a ring down path 144, 146 (e.g., switch and load), as the pMUT rings down at its natural frequency. Thus, after cessation of the transmission phase, then $S_{TX}$ switches 136*a*, 136*b* are deactivated (opened), and $S_{RX}$ receiver isolation switches 142a, 142b are activated (closed), along with an $S_{ring}$ switch 144 which is activated to ring down the transducer in response to current flow through a load (e.g., resistor) 146. It should be noted that in the embodiment of FIG. 3A, $S_{RX}$ receiver isolation switches 142a, 142b can be activated even when $S_{TX}$ switches 136a, 136b are still active. During ring down and later during measurement of received echoes, current from sensor 140 is amplified through a front end inverting OTA amplifier 148, providing output signal 150 to an anti-aliasing circuit 151, coupled to a second resonator 156, then a digitizing circuit 158 by the receiver normally, to output $d_{out}$ 160. During ring down, the ring down signal is I/Q demodulated with $f_{TX}$. The slope of the phase signal during the ring down indicates the frequency offset and is used to update $f_s$ and $f_{TX}$ used in the next measurement.

The following describes amplifier 148 subsequent circuits in greater detail. The front-end current from operational transconductance amplifier (OTA) 148 is integrated onto the integrating capacitor 152b of a second stage having amplifier 154, which also makes up an integrator in the first of two switched-capacitor resonators. Although the second stage is a switched capacitor integrator, the front-end current is processed in a continuous time (CT) manner before it is sampled at the output of the second integrator. As a result, the second integrator acts as an anti-aliasing filter for the wideband noise generated by the front-end and prevents this dominant noise source from being aliased into the band of interest. The signal then passes through a second switched capacitor resonator 156 and is quantized, as exemplified by a comparator 158, and output as digital output signal $d_{out}$ 160.

The CT AA circuit is shown in the figure receiving feedback as the inverse of $d_{out}$ 160 through series switch 162, capacitor 166, and switch 170. On either side of capacitor 166 are switches 164, 168 coupled to a DC supply. It will be seen that switches 162, 170 are controlled by a phase 1 (ϕ1) control signal, with switches 164, 168, controlled by a phase 2 (ϕ2) control signal. The signal through these switches is received at input 172 at a first stage amplifier circuit 176, having an integrating capacitor 174. Output from this first stage is coupled through a similar switching arrangement as prior to the first amplifier, having series switches 180, 188, on either side of capacitor 184, and switches 182, 186 coupled to a DC supply voltage. Output through this second switching arrangement is received at the second stage amplifier 154, having integrating capacitor 152b. The inverse of $d_{out}$ 160 received through switch 178 through capacitor 152a is also applied to the positive input of amplifier 154. A series capacitor 190 is seen coupled between inverting output of amplifier 154 to positive input of amplifier 176 through switch 194, controlled by phase 2 (ϕ2) signal, while a phase 1 (ϕ1) switch 192 is coupled to a DC supply. Although this implementation of CT AA filter is briefly described above, it should be appreciated that the A/D conversion mechanism can be achieved by various other circuits known to one of ordinary skill in the art.

The high in-band gain provided by the 4th order bandpass filter shapes the wideband quantization noise to be separated away from the signal at $f_{TX}$. In particular, the SC resonators are configured to resonate at 1/16 of the sampling frequency $f_s$ which is locked to the resonance of the transducer by the ring down auto tuning circuit. This centers the ΔΣ bandpass noise notch on the signal at $f_{TX}$.

The output of each ΔΣADC is I/Q demodulated, filtered, and down-sampled off-chip, such as depicted in FIG. 1A with a digital beam former processing the received signals to maximize the receive SNR and determine the x-angle location of the target. This process can be repeated in the orthogonal angle axis to implement 3D beamforming.

It should be noted that thermal noise in the front-end amplifier and the thermal motion of air, constrain the minimum detectable echo. The input referred noise of the amplifier is 11 nV/rt-Hz, and the noise voltage of the transducer is 6 nV/rt-Hz at resonance.

Figure 3B:
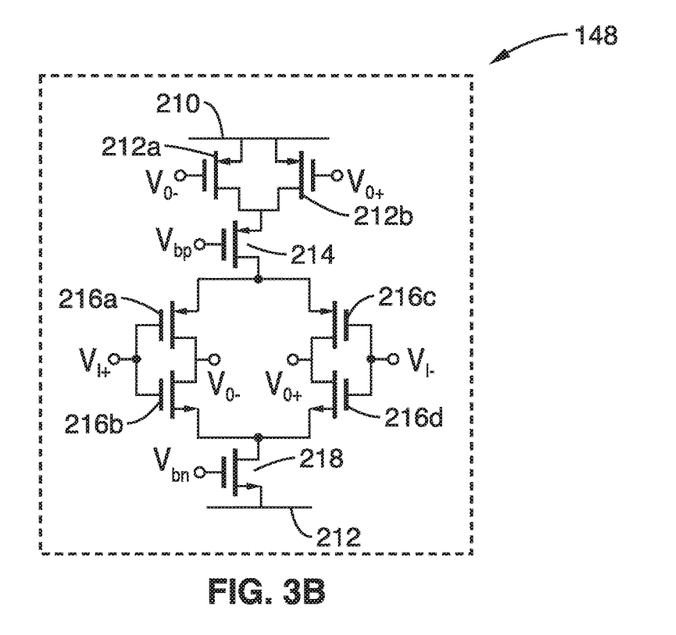
FIG. 3B is a schematic of a transconductance amplifier according to an embodiment of the present disclosure.

FIG. 3B illustrates an example circuit for the front end amplifier 148, shown by way of example and not limitation. The front-end amplifier consists of an open-loop current-reuse operational transconductance amplifier (OTA) with both NMOS and PMOS differential pairs biased near sub-threshold for current efficiency. From a first supply voltage 210 is seen coupled differentially-driven insulated gate FET transistors (e.g., PMOS) 212a, 212b, whose gates are driven respectively from differential output voltages $V_{O-}$, $V_{O+}$, whose combined current passes through a biasing stage with PMOS transistor 214 driven by a gate voltage $V_{bp}$. Another differential stage follows, followed by a combined bias current leg. In the differential stage, complementary transistors 216a, 216b (NMOS in series with PMOS) are in a first current leg which are driven at their gates by input voltage $V_{I+}$, and a second current leg with transistors 216c, 216d, driven at their gates by input voltage $V_{I-}$. Sources on transistors 216a, 216b are coupled together as output $V_{O-}$, with sources on transistors 216c, 216d coupled together as output $V_{O+}$. The final combined bias current leg is shown with a NMOS transistor 218 whose gate is driven by bias voltage $V_{bn}$ with its drain coupled to a second supply 212. It should be appreciated that amplifier 148 may be implemented in many different ways, as will be recognized by one of ordinary skill in the art, without departing from the teachings of the present disclosure.

Figure 3C:
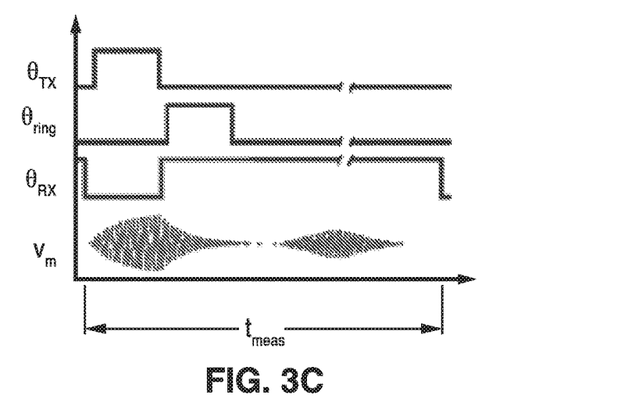
FIG. 3C is a timing diagram of signals associated with FIG. 3A according to an embodiment of the present disclosure.

FIG. 3C depicts signal timing associated with FIG. 3A, showing transmit activation signal $\theta_{TX}$, ring switch signal $\theta_{ring}$, receive activation signal $\theta_{RX}$, and measured acoustic wave voltage signal $v_m$. The transmitter is enabled by activating $\theta_{TX}$, and then switched off, followed by a ring down activation $\theta_{ring}$. After 86 μsec, the ring down signal has decayed sufficiently for the $S_{ring}$ switch to be opened by deactivating $\theta_{ring}$. Processing of ring down signals as well as the received echoes is performed with switches $\theta_{RX}$ activated. In the receive phase, the front-end measures a voltage which is proportional to the displacement of the transducer's membrane that occurs due to acoustic pressure incident on the membrane.

Figure 4:
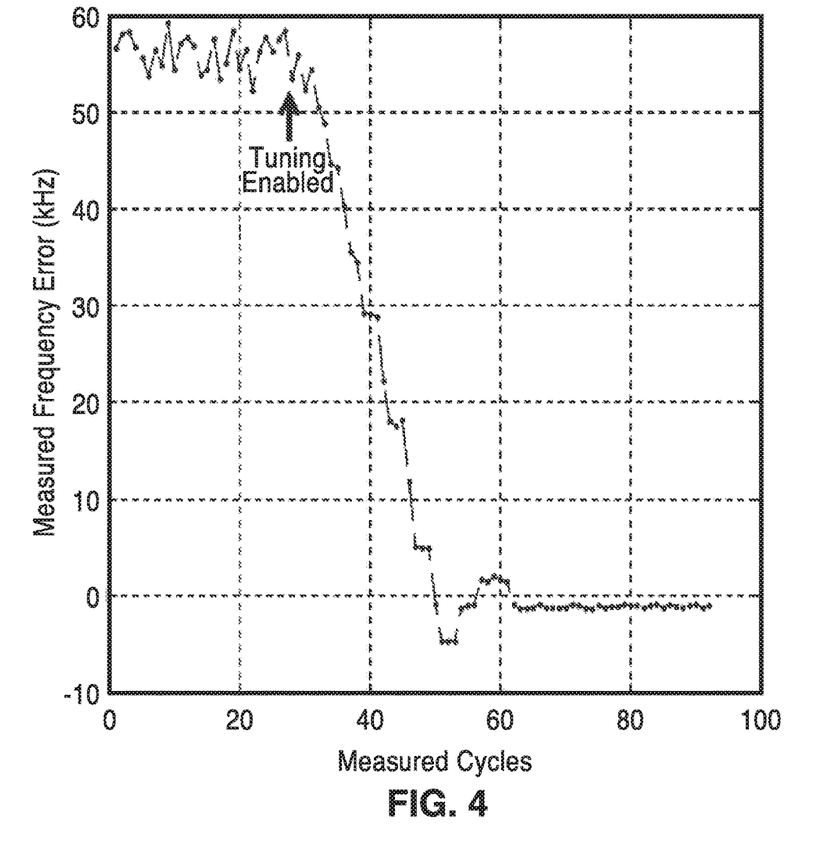
FIG. 4 is a plot of measured frequency error showing significant reduction when tuning according to an embodiment of the present disclosure is enabled.

FIG. 4 depicts offset measured by the frequency auto tuning loop as it is enabled (Tuning Enabled). An initial 57 kHz offset frequency is nulled to 1 kHz within 30 measurement cycles after auto tuning has been activated, illustrating a significant benefit from the frequency tuning and tracking according to the present disclosure.

The enhancements described in the presented technology can be readily implemented utilizing the described analog transmit/receive circuitry in combination with digital processing of I and Q signals during digital beam forming. One of ordinary skill in the art will recognize that the timing waveforms (e.g., exemplified in FIG. 2 and FIG. 3C) can be implemented with known digital techniques, including clock circuits, logic circuits, sequential circuits, programmable arrays, computer processing circuits, and combinations thereof without limitation. It should also be appreciated that computer processing circuits are preferably implemented to include one or more computer processor devices (e.g., CPU, microprocessor, microcontroller, computer enabled ASIC, etc.) and associated memory (e.g., RAM, DRAM, NVRAM, FLASH, computer readable media, etc.) whereby programming stored in the memory and executable on the processor perform steps of the digital beam forming process, and/or the control of circuit switch states and other operations as described herein. The computer and memory devices were not depicted in the diagrams for the sake of simplicity of illustration. The presented technology is non-limiting with regard to memory and computer-readable media, insofar as these are non-transitory, and thus not constituting a transitory electronic signal. It will also be appreciated that the computer readable media (memory) in the system is "non-transitory", which comprises any and all forms of computer-readable media, with the sole exception being a transitory, propagating signal. Accordingly, the disclosed technology may comprise any form of computer-readable media, including those which are random access (e.g., RAM), require periodic refreshing (e.g., DRAM), those that degrade over time (e.g., EEPROMS, disk media), or that store data for only short periods of time and/or only in the presence of power, with the only limitation being that the term "computer readable media" is not applicable to an electronic signal which is transitory.

Embodiments of the present technology may be described with reference to flowchart or timing diagram illustrations of methods and systems according to embodiments of the technology, and/or algorithms, formulae, or other computational depictions, which may also be implemented as computer program products. In this regard, each block or step of a flowchart, and combinations of blocks (and/or steps) in a flowchart, algorithm, formula, or computational depiction can be implemented by various means, such as hardware, firmware, and/or software including one or more computer program instructions embodied in computer-readable program code logic. As will be appreciated, any such computer program instructions may be loaded onto a computer, including without limitation a general purpose computer or special purpose computer, or other programmable processing apparatus to produce a machine, such that the computer program instructions which execute on the computer or other programmable processing apparatus create means for implementing the functions specified in the block(s) of the flowchart(s).

Accordingly, blocks of the flowcharts, algorithms, formulae, or computational depictions support combinations of means for performing the specified functions, combinations of steps for performing the specified functions, and computer program instructions, such as embodied in computer-readable program code logic means, for performing the specified functions. It will also be understood that each block of the flowchart illustrations, algorithms, formulae, or computational depictions and combinations thereof described herein, can be implemented by special purpose hardware-based computer systems which perform the specified functions or steps, or combinations of special purpose hardware and computer-readable program code logic means.

Furthermore, these computer program instructions, such as embodied in computer-readable program code logic, may also be stored in a computer-readable memory that can direct a computer or other programmable processing apparatus to function in a particular manner, such that the instructions stored in the computer-readable memory produce an article of manufacture including instruction means which implement the function specified in the block(s) of the flowchart(s). The computer program instructions may also be loaded onto a computer or other programmable processing apparatus to cause a series of operational steps to be performed on the computer or other programmable processing apparatus to produce a computer-implemented process such that the instructions which execute on the computer or other programmable processing apparatus provide steps for implementing the functions specified in the block(s) of the flowchart(s), algorithm(s), formula(e), or computational depiction(s).

It will further be appreciated that "programming" as used herein refers to one or more instructions that can be executed by a processor to perform a function as described herein. The programming can be embodied in software, in firmware, or in a combination of software and firmware. The programming can be stored local to the device in non-transitory media, or can be stored remotely such as on a server, or all or a portion of the programming can be stored locally and remotely. Programming stored remotely can be downloaded (pushed) to the device by user initiation, or automatically based on one or more factors. It will further be appreciated that as used herein, that the terms processor, central processing unit (CPU), and computer are used synonymously to denote a device capable of executing the programming and communication with input/output interfaces and/or peripheral devices.

From the description herein, it will be appreciated that that the present disclosure encompasses multiple embodiments which include, but are not limited to, the following:

1. An apparatus for locking an electrical system to a resonant mechanical system, the apparatus comprising: an electromechanical transducer, of a resonant mechanical subsystem, configured for operation in a transmission mode for generating acoustic pulses; and an electrical subsystem having a transmitter circuit coupled to said electromechanical transducer, in which acoustic pulses are generated from said electromechanical transducer in response to receipt of an electrical signal at an electronic transmission frequency from said electrical subsystem; wherein said electrical subsystem is configured to determine operating frequency of the resonant mechanical subsystem from a resonance settling response of the electromechanical transducer when not being driven in its transmission mode; and wherein the electrical subsystem is configured to lock transmitting frequency of said electrical subsystem to that of said resonant mechanical subsystem by either (a) tuning operating frequency of said electrical subsystem to match that of said resonant mechanical subsystem or (b) tuning operating frequency of said resonant mechanical subsystem to match that of said electrical subsystem.

2. The apparatus of any preceding embodiment, wherein frequency difference between the electromechanical resonance settling response and electronic transmission frequency is used to determine required adjustment to said transmission frequency to make these two frequencies match.

3. The apparatus of any preceding embodiment, wherein a phase difference between the electromechanical resonance settling response and electronic transmission frequency is used to determine required adjustment to said transmission frequency to make these two frequencies match.

4. The apparatus of any preceding embodiment, wherein a decay time constant of said electromechanical resonance settling response is estimated by measuring amplitude of said electromechanical resonance settling response at two or more points in time.

5. The apparatus of any preceding embodiment, wherein said settling response for said resonant electromechanical subsystem is determined in response to utilizing in-phase (I) and quadrature (Q) signals within an auto tuning circuit configured to adjust transmission frequency.

6. The apparatus of any preceding embodiment, further comprising a ring down circuit selectively coupled to said electromechanical transducer so that said ring down circuit attenuates resonance energy on said resonant mechanical subsystem when determining the operating frequency of said resonant mechanical subsystem from a resonance settling response.

7. The apparatus of any preceding embodiment, wherein said electromechanical transducer comprises at least one ultrasonic transducer.

8. The apparatus of any preceding embodiment, wherein said electromechanical transducer comprises at least one piezoelectric transducer.

9. The apparatus of any preceding embodiment, wherein said electromechanical transducer comprises at least one capacitive transducer.

10. The apparatus of any preceding embodiment, wherein said electromechanical transducer has a narrowband resonance, with a maximum transmit and receive sensitivity at resonant frequency of said electromechanical transducer.

11. The apparatus of any preceding embodiment, wherein the transmitted acoustic pulses are a harmonic signal with a center frequency equal to resonant frequency of said electromechanical transducer.

12. The apparatus of any preceding embodiment, wherein said resonance settling response is determined by processing a signal from said electromechanical transducer by an amplifier, followed by digitization circuitry whose output is utilized in a ring down auto tuning circuit for controlling frequency output for driving said transmitter circuit.

13. The apparatus of any preceding embodiment, further comprising an electrical filter on an output of said amplifier, said filter configured with a center frequency equal to that of said electromechanical transducer.

14. The apparatus of any preceding embodiment, wherein said electrical filter comprises a multiple-order filter.

15. The apparatus of any preceding embodiment, wherein said electrical filter comprises a fourth-order switched-capacitor filter.

16. The apparatus of any preceding embodiment, further comprising a complex demodulator configured for receiving output from said electrical filter, which has been digitized, along with receiving phase signals at transmission frequency, and outputting in-phase (I) and quadrature (Q) signals.

17. The apparatus of any preceding embodiment, wherein said in-phase (I) and quadrature (Q) signals are digitally filtered prior to receipt within an auto tuning circuit configured to adjust transmission frequency.

18. The apparatus of any preceding embodiment, wherein a switching circuit selects between transmission mode or receiving mode for said electromechanical transducer.

19. The apparatus of any preceding embodiment, further comprising a modulator configured for receiving at least one electrical signal that is encoded for transmission using a form of amplitude modulation, or phase modulation, or a combination of amplitude and phase modulation through said transmitter circuit.

20. An apparatus for frequency locking between an electrical system and a resonant mechanical system, the apparatus comprising: an electromechanical transducer, of a resonant mechanical subsystem, configured for operation in a transmission mode for generating acoustic pulses; an electrical subsystem having a transmitter circuit coupled to said electromechanical transducer, wherein acoustic pulses are generated from said electromechanical transducer in response to receipt of an electrical signal at an electronic transmission frequency from said electrical subsystem; and a ring down circuit selectively coupled to said electromechanical transducer for attenuating its resonance energy when said electromechanical transducer is not operating in its transmission mode; wherein said electrical subsystem is configured to determine operating frequency of the resonant mechanical subsystem from a resonance settling response of the electromechanical transducer when it's not being driven in its transmission mode; and wherein the electrical subsystem is configured to lock transmitting frequency of said electrical subsystem to that of said resonant mechanical subsystem by either (a) tuning operating frequency of said electrical subsystem to match that of said resonant mechanical subsystem or (b) tuning operating frequency of said resonant mechanical subsystem to match that of said electrical subsystem.

21. The apparatus of any preceding embodiment, wherein frequency difference between the electromechanical resonance settling response and electronic transmission frequency is used to determine required adjustment to said transmission frequency to make these two frequencies match.

22. The apparatus of any preceding embodiment, wherein a phase difference between the electromechanical resonance settling response and electronic transmission frequency is used to determine required adjustment to said transmission frequency to make these two frequencies match.

23. The apparatus of any preceding embodiment, wherein a decay time constant of said electromechanical resonance settling response is estimated by measuring amplitude of said electromechanical resonance settling response at two or more points in time.

24. The apparatus of any preceding embodiment, wherein said settling response for said resonant electromechanical subsystem is determined in response to utilizing in-phase (I) and quadrature (Q) signals within an auto tuning circuit configured to adjust transmission frequency.

25. The apparatus of any preceding embodiment, wherein said electromechanical transducer comprises at least one ultrasonic transducer.

26. The apparatus of any preceding embodiment, wherein said electromechanical transducer comprises at least one piezoelectric transducer.

27. The apparatus of any preceding embodiment, wherein said electromechanical transducer comprises at least one capacitive transducer.

28. The apparatus of any preceding embodiment, wherein said resonance settling response is determined by processing a signal from said electromechanical transducer by an amplifier, followed by digitization circuitry whose output is utilized in a ring down auto tuning circuit for controlling frequency output for driving said transmitter circuit.

29. The apparatus of any preceding embodiment, further comprising an electrical filter on an output of said amplifier, said filter configured with a center frequency equal to that of said electromechanical transducer.

30. The apparatus of any preceding embodiment, wherein said electrical filter comprises a multiple-order filter switched-capacitor filter.

31. The apparatus of any preceding embodiment, further comprising a complex demodulator configured for receiving output from said electrical filter, which has been digitized, along with receiving phase signals at transmission frequency, and outputting in-phase (I) and quadrature (Q) signals.

32. The apparatus of any preceding embodiment, wherein said in-phase (I) and quadrature (Q) signals are digitally filtered prior to receipt within an auto tuning circuit configured to adjust transmission frequency.

33. The apparatus of any preceding embodiment, further comprising a modulator configured for receiving at least one electrical signal that is encoded for transmission using a form of amplitude modulation, or phase modulation, or a combination of amplitude and phase modulation through said transmitter circuit.

34. The apparatus of any preceding embodiment, further comprising utilizing said electromechanical transducer in a receiving mode, and processing echoes of acoustic pulses to determined time of flight.

35. A method for locking an electrical system to a mechanical transducer system, comprising: generating acoustic pulses from an electromechanical transducer within a mechanical transducer subsystem in response to receiving a transmit signal from a transmitter in an electrical subsystem; registering settling behavior of said mechanical transducer subsystem, when said transmit signal goes inactive and is thus no longer driving an output from said electromechanical transducer; determining operating frequency of said mechanical transducer subsystem from the settling behavior of said electromechanical transducer; and locking the electrical subsystem to the mechanical transducer subsystem by either (a) tuning operating frequency of said electrical subsystem to match that of said mechanical transducer subsystem or (b) tuning operating frequency of said mechanical transducer system to match that of said electrical subsystem.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. An apparatus for locking an electrical system to a resonant mechanical system, the apparatus comprising:
    an electromechanical transducer, of a resonant mechanical subsystem, configured for operation in a transmission mode for generating acoustic pulses; and
    an electrical subsystem having a transmitter circuit coupled to said electromechanical transducer, in which acoustic pulses are generated from said electromechanical transducer in response to receipt of an electrical signal at an electronic transmission frequency from said electrical subsystem;
    wherein said electrical subsystem is configured to determine operating frequency of the resonant mechanical subsystem from a resonance settling response of the electromechanical transducer when not being driven in its transmission mode; and
    wherein the electrical subsystem is configured to lock transmitting frequency of said electrical subsystem to that of said resonant mechanical subsystem by either (a) tuning operating frequency of said electrical subsystem to match that of said resonant mechanical subsystem or (b) tuning operating frequency of said resonant mechanical subsystem to match that of said electrical subsystem;
    wherein a phase difference between the electromechanical resonance settling response and electronic transmission frequency is used to determine required adjustment to said transmission frequency to make these two frequencies match.

2. An apparatus for locking an electrical system to a resonant mechanical system, the apparatus comprising:
    an electromechanical transducer, of a resonant mechanical subsystem, configured for operation in a transmission mode for generating acoustic pulses; and
    an electrical subsystem having a transmitter circuit coupled to said electromechanical transducer, in which acoustic pulses are generated from said electromechanical transducer in response to receipt of an electrical signal at an electronic transmission frequency from said electrical subsystem;
    wherein said electrical subsystem is configured to determine operating frequency of the resonant mechanical subsystem from a resonance settling response of the electromechanical transducer when not being driven in its transmission mode;
    wherein the electrical subsystem is configured to lock transmitting frequency of said electrical subsystem to that of said resonant mechanical subsystem by either (a) tuning operating frequency of said electrical subsystem to match that of said resonant mechanical subsystem or (b) tuning operating frequency of said resonant mechanical subsystem to match that of said electrical subsystem; and
    wherein a decay time constant of said electromechanical resonance settling response is estimated by measuring amplitude of said electromechanical resonance settling response at two or more points in time.

3. An apparatus for locking an electrical system to a resonant mechanical system, the apparatus comprising:
    an electromechanical transducer, of a resonant mechanical subsystem, configured for operation in a transmission mode for generating acoustic pulses; and
    an electrical subsystem having a transmitter circuit coupled to said electromechanical transducer, in which acoustic pulses are generated from said electromechanical transducer in response to receipt of an electrical signal at an electronic transmission frequency from said electrical subsystem;
    wherein said electrical subsystem is configured to determine operating frequency of the resonant mechanical subsystem from a resonance settling response of the electromechanical transducer when not being driven in its transmission mode;
    wherein the electrical subsystem is configured to lock transmitting frequency of said electrical subsystem to that of said resonant mechanical subsystem by either (a) tuning operating frequency of said electrical subsystem to match that of said resonant mechanical subsystem or (b) tuning operating frequency of said resonant mechanical subsystem to match that of said electrical subsystem; and wherein said settling response for said resonant electromechanical subsystem is determined in response to utilizing in-phase (I) and quadrature (Q) signals within an auto tuning circuit configured to adjust transmission frequency.

4. An apparatus for locking an electrical system to a resonant mechanical system, the apparatus comprising:
an electromechanical transducer, of a resonant mechanical subsystem, configured for operation in a transmission mode for generating acoustic pulses;
an electrical subsystem having a transmitter circuit coupled to said electromechanical transducer, in which acoustic pulses are generated from said electromechanical transducer in response to receipt of an electrical signal at an electronic transmission frequency from said electrical subsystem;
wherein said electrical subsystem is configured to determine operating frequency of the resonant mechanical subsystem from a resonance settling response of the electromechanical transducer when not being driven in its transmission mode;
wherein the electrical subsystem is configured to lock transmitting frequency of said electrical subsystem to that of said resonant mechanical subsystem by either (a) tuning operating frequency of said electrical subsystem to match that of said resonant mechanical subsystem or (b) tuning operating frequency of said resonant mechanical subsystem to match that of said electrical subsystem; and
a ring down circuit selectively coupled to said electromechanical transducer so that said ring down circuit attenuates resonance energy on said resonant mechanical subsystem when determining the operating frequency of said resonant mechanical subsystem from a resonance settling response.

5. The apparatus as recited in claim 1, wherein said electromechanical transducer comprises at least one ultrasonic transducer.

6. The apparatus as recited in claim 1, wherein said electromechanical transducer comprises at least one piezoelectric transducer.

7. The apparatus as recited in claim 1, wherein said electromechanical transducer comprises at least one capacitive transducer.

8. An apparatus for locking an electrical system to a resonant mechanical system, the apparatus comprising:
an electromechanical transducer, of a resonant mechanical subsystem, configured for operation in a transmission mode for generating acoustic pulses; and
an electrical subsystem having a transmitter circuit coupled to said electromechanical transducer, in which acoustic pulses are generated from said electromechanical transducer in response to receipt of an electrical signal at an electronic transmission frequency from said electrical subsystem;
wherein said electrical subsystem is configured to determine operating frequency of the resonant mechanical subsystem from a resonance settling response of the electromechanical transducer when not being driven in its transmission mode;
wherein the electrical subsystem is configured to lock transmitting frequency of said electrical subsystem to that of said resonant mechanical subsystem by either (a) tuning operating frequency of said electrical subsystem to match that of said resonant mechanical subsystem or (b) tuning operating frequency of said resonant mechanical subsystem to match that of said electrical subsystem; and wherein said electromechanical transducer has a narrowband resonance, with a maximum transmit and receive sensitivity at resonant frequency of said electromechanical transducer.

9. An apparatus for locking an electrical system to a resonant mechanical system, the apparatus comprising:
an electromechanical transducer, of a resonant mechanical subsystem, configured for operation in a transmission mode for generating acoustic pulses; and
an electrical subsystem having a transmitter circuit coupled to said electromechanical transducer, in which acoustic pulses are generated from said electromechanical transducer in response to receipt of an electrical signal at an electronic transmission frequency from said electrical subsystem;
wherein said electrical subsystem is configured to determine operating frequency of the resonant mechanical subsystem from a resonance settling response of the electromechanical transducer when not being driven in its transmission mode;
wherein the electrical subsystem is configured to lock transmitting frequency of said electrical subsystem to that of said resonant mechanical subsystem by either (a) tuning operating frequency of said electrical subsystem to match that of said resonant mechanical subsystem or (b) tuning operating frequency of said resonant mechanical subsystem to match that of said electrical subsystem; and
wherein the transmitted acoustic pulses are a harmonic signal with a center frequency equal to resonant frequency of said electromechanical transducer.

10. An apparatus for locking an electrical system to a resonant mechanical system, the apparatus comprising:
an electromechanical transducer, of a resonant mechanical subsystem, configured for operation in a transmission mode for generating acoustic pulses; and
an electrical subsystem having a transmitter circuit coupled to said electromechanical transducer, in which acoustic pulses are generated from said electromechanical transducer in response to receipt of an electrical signal at an electronic transmission frequency from said electrical subsystem;
wherein said electrical subsystem is configured to determine operating frequency of the resonant mechanical subsystem from a resonance settling response of the electromechanical transducer when not being driven in its transmission mode;
wherein the electrical subsystem is configured to lock transmitting frequency of said electrical subsystem to that of said resonant mechanical subsystem by either (a) tuning operating frequency of said electrical subsystem to match that of said resonant mechanical subsystem or (b) tuning operating frequency of said resonant mechanical subsystem to match that of said electrical subsystem; and
wherein said resonance settling response is determined by processing a signal from said electromechanical transducer by an amplifier, followed by digitization circuitry whose output is utilized in a ring down auto tuning circuit for controlling frequency output for driving said transmitter circuit.

11. The apparatus as recited in claim 10, further comprising an electrical filter on an output of said amplifier, said filter configured with a center frequency equal to that of said electromechanical transducer.

12. The apparatus as recited in claim 11, wherein said electrical filter comprises a multiple-order filter.

13. The apparatus as recited in claim 12, wherein said electrical filter comprises a fourth-order switched-capacitor filter.

14. The apparatus as recited in claim 11, further comprising a complex demodulator configured for receiving output from said electrical filter, which has been digitized, along with receiving phase signals at transmission frequency, and outputting in-phase (I) and quadrature (Q) signals.

15. The apparatus as recited in claim 14, wherein said in-phase (I) and quadrature (Q) signals are digitally filtered prior to receipt within an auto tuning circuit configured to adjust transmission frequency.

16. The apparatus as recited in claim 14, further comprising a modulator configured for receiving at least one electrical signal that is encoded for transmission using a form of amplitude modulation, or phase modulation, or a combination of amplitude and phase modulation through said transmitter circuit.

17. An apparatus for frequency locking between an electrical system and a resonant mechanical system, the apparatus comprising:
an electromechanical transducer, of a resonant mechanical subsystem, configured for operation in a transmission mode for generating acoustic pulses;
an electrical subsystem having a transmitter circuit coupled to said electromechanical transducer, wherein acoustic pulses are generated from said electromechanical transducer in response to receipt of an electrical signal at an electronic transmission frequency from said electrical subsystem; and
a ring down circuit selectively coupled to said electromechanical transducer for attenuating its resonance energy when said electromechanical transducer is not operating in its transmission mode;
wherein said electrical subsystem is configured to determine operating frequency of the resonant mechanical subsystem from a resonance settling response of the electromechanical transducer when it's not being driven in its transmission mode; and
wherein the electrical subsystem is configured to lock transmitting frequency of said electrical subsystem to that of said resonant mechanical subsystem by either (a) tuning operating frequency of said electrical subsystem to match that of said resonant mechanical subsystem or (b) tuning operating frequency of said resonant mechanical subsystem to match that of said electrical subsystem.

18. The apparatus as recited in claim 17, wherein frequency difference between the electromechanical resonance settling response and electronic transmission frequency is used to determine required adjustment to said transmission frequency to make these two frequencies match.

19. The apparatus as recited in claim 17, wherein a phase difference between the electromechanical resonance settling response and electronic transmission frequency is used to determine required adjustment to said transmission frequency to make these two frequencies match.

20. The apparatus as recited in claim 17, wherein a decay time constant of said electromechanical resonance settling response is estimated by measuring amplitude of said electromechanical resonance settling response at two or more points in time.

21. The apparatus as recited in claim 17, wherein said settling response for said resonant electromechanical subsystem is determined in response to utilizing in-phase (I) and quadrature (Q) signals within an auto tuning circuit configured to adjust transmission frequency.

22. The apparatus as recited in claim 17, wherein said electromechanical transducer comprises at least one ultrasonic transducer.

23. The apparatus as recited in claim 17, wherein said electromechanical transducer comprises at least one piezoelectric transducer.

24. The apparatus as recited in claim 17, wherein said electromechanical transducer comprises at least one capacitive transducer.

25. The apparatus as recited in claim 17, wherein said resonance settling response is determined by processing a signal from said electromechanical transducer by an amplifier, followed by digitization circuitry whose output is utilized in a ring down auto tuning circuit for controlling frequency output for driving said transmitter circuit.

26. The apparatus as recited in claim 25, further comprising an electrical filter on an output of said amplifier, said filter configured with a center frequency equal to that of said electromechanical transducer.

27. The apparatus as recited in claim 26, wherein said electrical filter comprises a multiple-order filter switched-capacitor filter.

28. The apparatus as recited in claim 26, further comprising a complex demodulator configured for receiving output from said electrical filter, which has been digitized, along with receiving phase signals at transmission frequency, and outputting in-phase (I) and quadrature (Q) signals.

29. The apparatus as recited in claim 28, wherein said in-phase (I) and quadrature (Q) signals are digitally filtered prior to receipt within an auto tuning circuit configured to adjust transmission frequency.

30. The apparatus as recited in claim 17, further comprising a modulator configured for receiving at least one electrical signal that is encoded for transmission using a form of amplitude modulation, or phase modulation, or a combination of amplitude and phase modulation through said transmitter circuit.

31. The apparatus as recited in claim 17, further comprising utilizing said electromechanical transducer in a receiving mode, and processing echoes of acoustic pulses to determined time of flight.

32. The apparatus as recited in claim 2, wherein said electromechanical transducer comprises a transducer from a group of transducer types selected from: ultrasonic transducers, piezoelectric transducers, and capacitive transducers.

33. The apparatus as recited in claim 3, wherein said electromechanical transducer comprises a transducer from a group of transducer types selected from: ultrasonic transducers, piezoelectric transducers, and capacitive transducers.

34. The apparatus as recited in claim 4, wherein said electromechanical transducer comprises a transducer from a group of transducer types selected from: ultrasonic transducers, piezoelectric transducers, and capacitive transducers.

35. The apparatus as recited in claim 8, wherein said electromechanical transducer comprises a transducer from a group of transducer types selected from: ultrasonic transducers, piezoelectric transducers, and capacitive transducers.

36. The apparatus as recited in claim 9, wherein said electromechanical transducer comprises a transducer from a group of transducer types selected from: ultrasonic transducers, piezoelectric transducers, and capacitive transducers.

37. The apparatus as recited in claim 10, wherein said electromechanical transducer comprises a transducer from a group of transducer types selected from: ultrasonic transducers, piezoelectric transducers, and capacitive transducers.

\* \* \* \* \*